(12) United States Patent
Lin et al.

(10) Patent No.: US 7,304,853 B2
(45) Date of Patent: Dec. 4, 2007

(54) APPARATUS OF OPTICAL DISPLAY MODULE FOR FIXING CIRCUIT BOARD

(75) Inventors: Yi-Chin Lin, Taichung (TW); Kun-Chang Ho, Taichung County (TW)

(73) Assignee: Wintek Corporation (TW)

( * ) Notice: Subject to any disclaimer, the term of this patent is extended or adjusted under 35 U.S.C. 154(b) by 182 days.

(21) Appl. No.: 11/078,311

(22) Filed: Mar. 14, 2005

(65) Prior Publication Data

US 2006/0139889 A1   Jun. 29, 2006

(30) Foreign Application Priority Data

Dec. 24, 2004   (TW) .............................. 93220928 U

(51) Int. Cl.
*H05K 7/20* (2006.01)

(52) U.S. Cl. ........................ 361/715; 361/756; 361/759

(58) Field of Classification Search ................ 361/737, 361/742, 753, 756, 758, 770, 804, 806
See application file for complete search history.

(56) References Cited

U.S. PATENT DOCUMENTS

| 5,984,692 | A  | * | 11/1999 | Kumagai et al. ............. 439/66 |
| 6,493,241 | B1 | * | 12/2002 | Horng ......................... 361/818 |
| 7,085,141 | B2 | * | 8/2006  | Yi .............................. 361/804 |

* cited by examiner

*Primary Examiner*—Dean A. Reichard
*Assistant Examiner*—Yuriy Semenenko
(74) *Attorney, Agent, or Firm*—Bacon & Thomas, PLLC

(57) ABSTRACT

An optical display module comprises a circuit board, a supporting device and four connecting devices. The connecting devices are bonded on the circuit board by welding. The supporting device has four slots associated with the connecting devices. The supporting device is attached on the circuit board to engage the slots with the connecting devices respectively to bond the supporting device and the circuit board firmly.

7 Claims, 12 Drawing Sheets

APPARATUS OF OPTICAL DISPLAY MODULE FOR FIXING CIRCUIT BOARD

BACKGROUND OF THE INVENTION

1. Field of the Invention

The present invention relates generally to a display, and more particularly to an optical display module having an apparatus to fix the circuit board.

2. Description of the Related Art

FIG. 1 shows parts of a conventional optical display module, which has a plastic frame 1, a twin adhesive tape 2, a printed circuit board 3 and a metal frame 4. A panel 5 is rested on the plastic frame 1, and the printed circuit board 3 is attached on the plastic frame 1 by the twin adhesive tape 2. The metal frame 4 is covered on the plastic frame 1. The metal frame 4 has a plate 4a on which a tin paste layer 4b is provided to be fixed to a back side of the printed circuit board 3 by welding, referring to FIG. 2 and FIG. 3.

The twin adhesive tape 2 is sensitive to environment, such as heat makes the adhesive of the tape molten and flowing, cold makes the adhesive solidified, and moisture makes the adhesive deteriorated. These conditions cause the twin adhesive tape 2 can not bond the printed circuit board 3 on the plastic frame 1 firmly, so that the twin adhesive tape 2 is not a well element to bond the printed circuit board 3.

The metal frame 4 has functions of protecting the plastic frame 1 and electrostatic discharge. In view of durability, the metal frame 4 usually is made of stainless with a specific surface treatment. Such metal frame 4 is hard for the tin paste bonded on it, so called "false welding". Operator has to coated more tin paste to make sure that the printed circuit board 3 is bonded on the metal frame 4 firmly. That makes the welding process harder.

FIG. 4 shows another conventional optical display module. A plastic frame 6 has plural hooks 6a at a margin thereof, and a circuit board 7 has plural slots 7a to be engaged with the hooks 6a respectively. Such structure has no twin adhesive tape involved. But in practice, the hooks 6a will be interfered with other elements.

SUMMARY OF THE INVENTION

The primary objective of the present invention is to provide an optical display module, which has an apparatus to fix the circuit board rapidly and firmly.

The secondary objective of the present invention is to provide an optical display module, in which no adhesive is involved, and less false welding is occurred.

According to the objective of the present invention, an optical display module comprises a circuit board, a supporting device having at least a connecting portion, and at least a connecting device. The connecting device has a top, a bottom and a locking portion between the top and the bottom. The bottom of the connecting device is fixed on the circuit board, and the locking portion is engaged with the connecting portion of the supporting device.

DETAILED DESCRIPTION OF THE INVENTION

Figure 1:
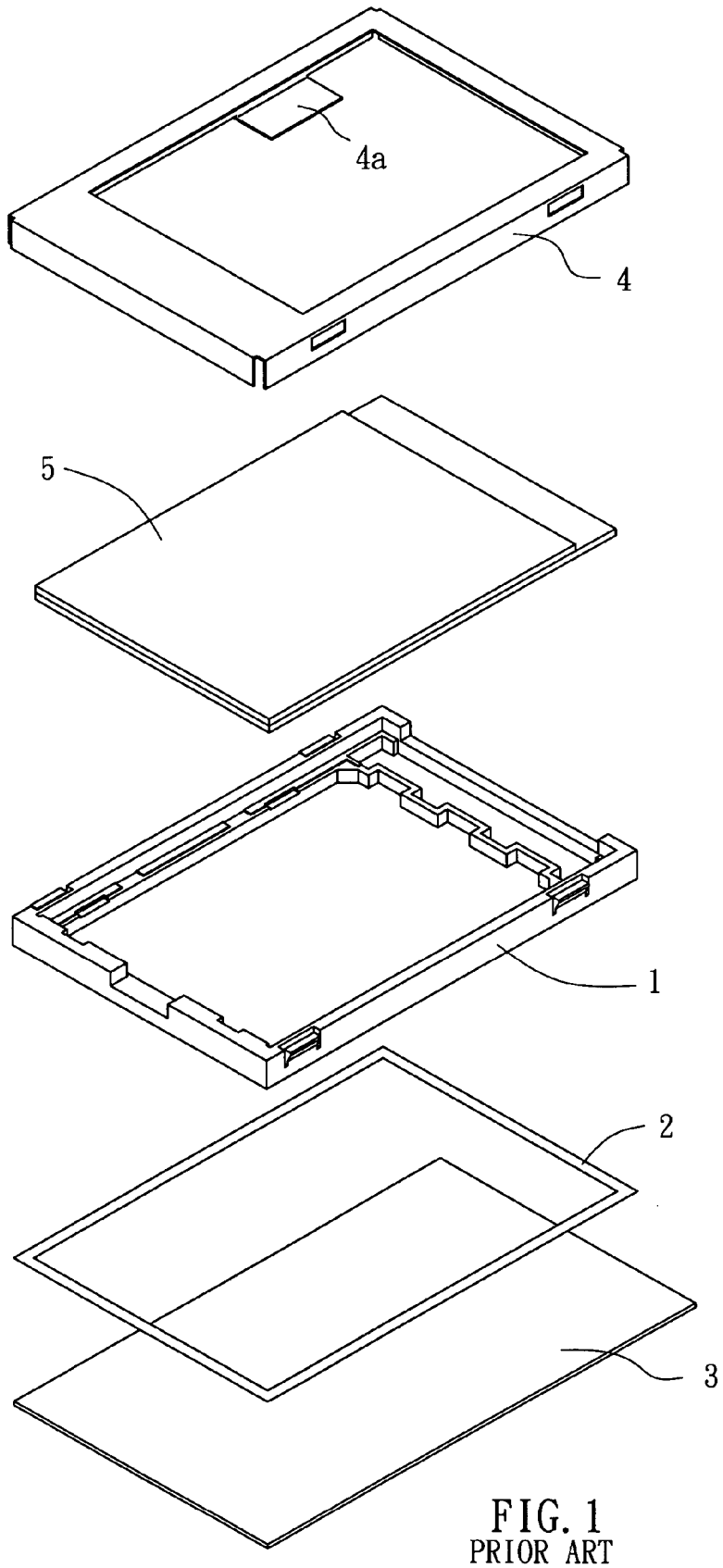
FIG. 1 is an exploded view of the conventional apparatus to fix the circuit board.
Figure 2:
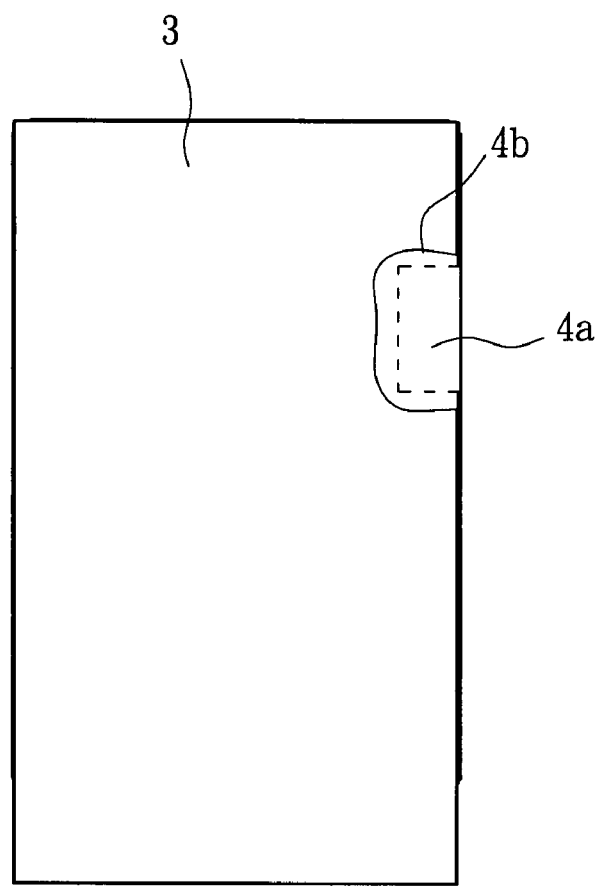
FIG. 2 is a rear view of FIG. 1.
Figure 3:
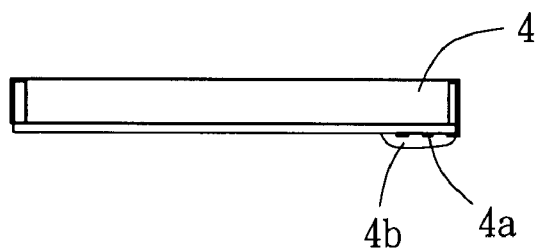
FIG. 3 is a lateral view of FIG. 1.
Figure 4:
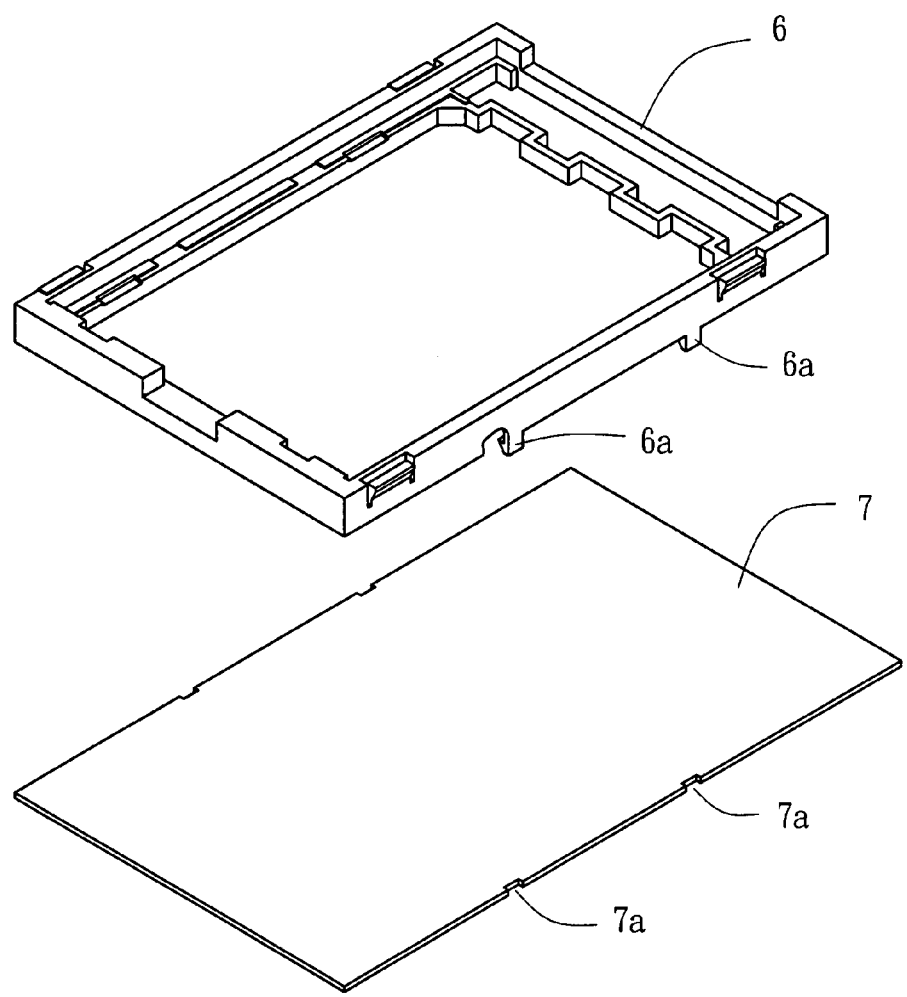
FIG. 4 is a top view of another conventional apparatus to fix the circuit board.
Figure 5:
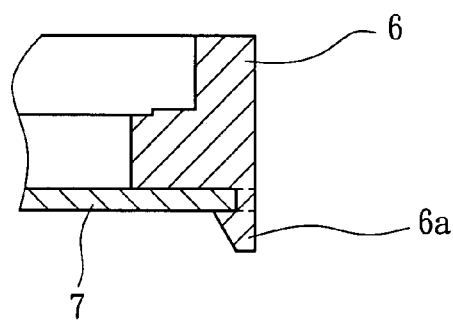
FIG. 5 is a lateral view of a part of FIG. 4.
Figure 6:
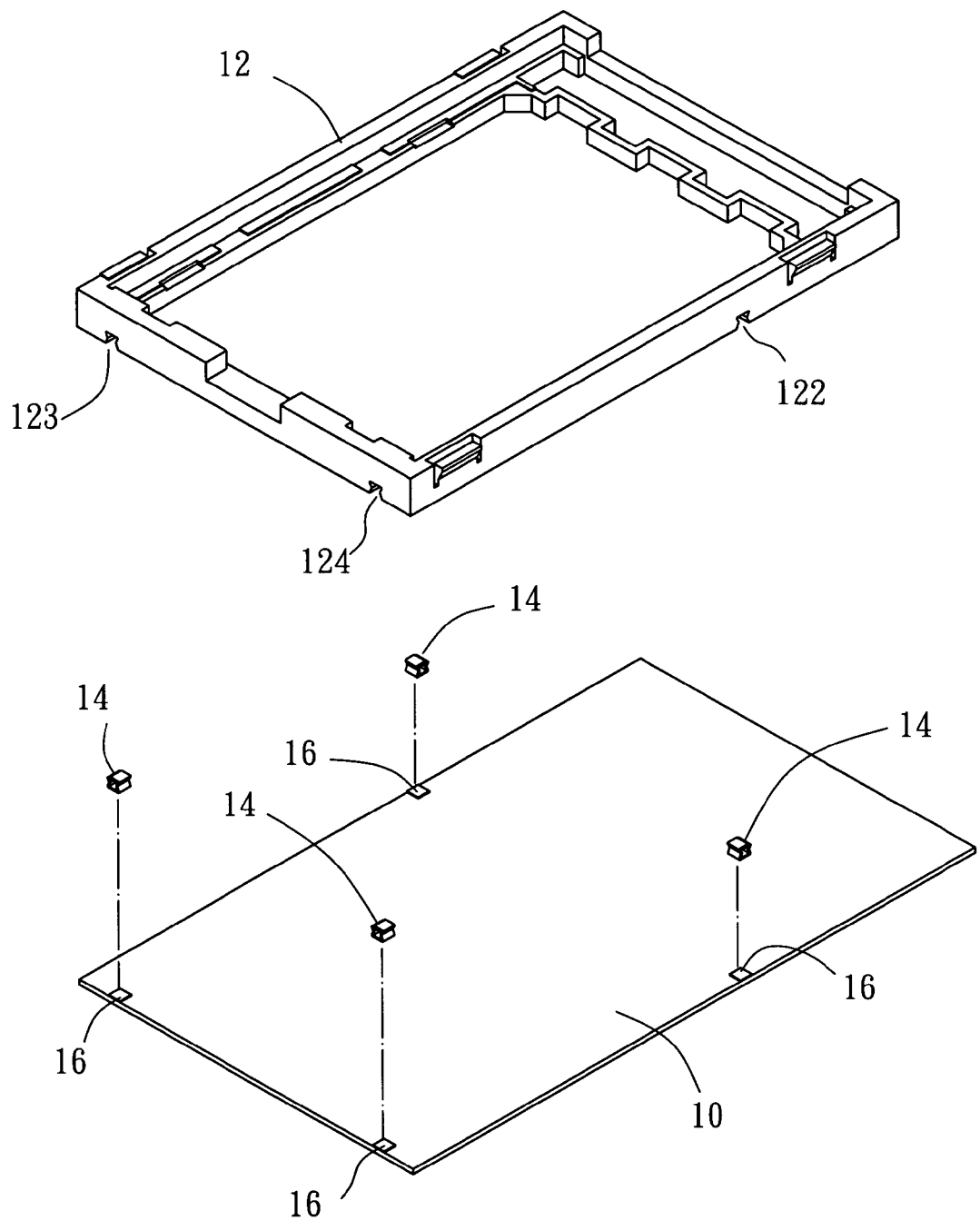
FIG. 6 is an exploded view of a first preferred embodiment of the present invention.

As shown in FIG. 6, an optical display module of the first preferred embodiment of the present invention mainly comprises a circuit board 10, a supporting device 12 and four connecting device 14.

The circuit board 10 is a printed circuit board (PCB) in the present invention. It can be a flexible printed circuit board (FPCB) also.

Figure 7:
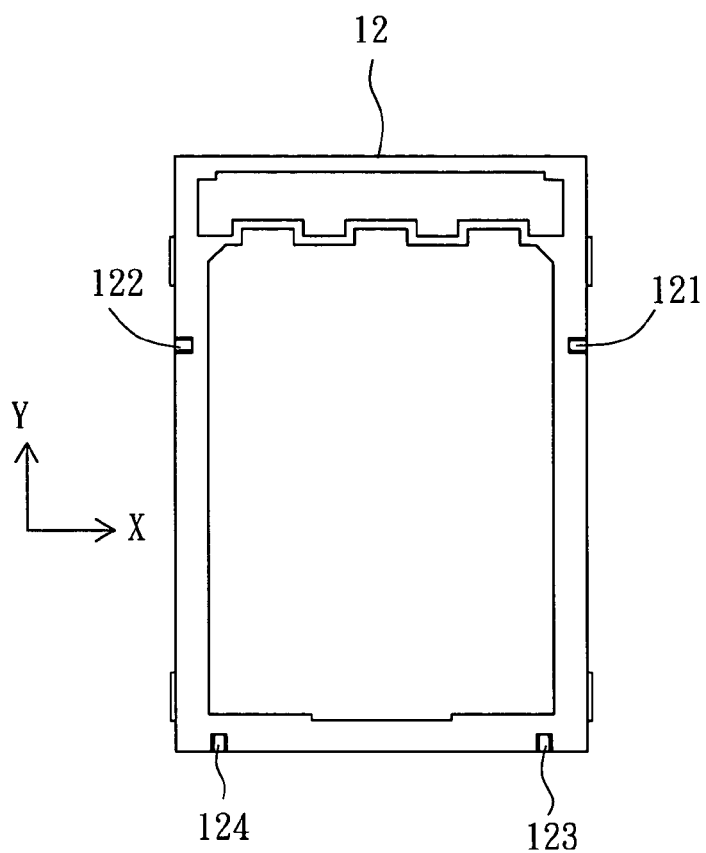
FIG. 7 is a bottom view of the supporting device of the first preferred embodiment of the present invention.
Figure 9:
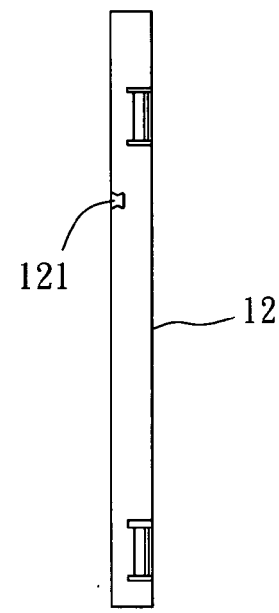
FIG. 9 is a left view of the supporting device of the first preferred embodiment of the present invention.
Figure 8:
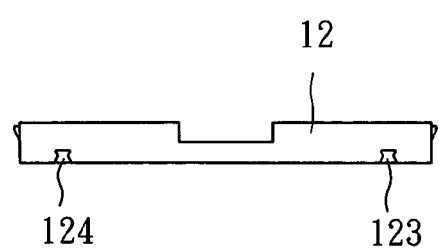
FIG. 8 is a front view of the supporting device of the first preferred embodiment of the present invention.
Figure 13:
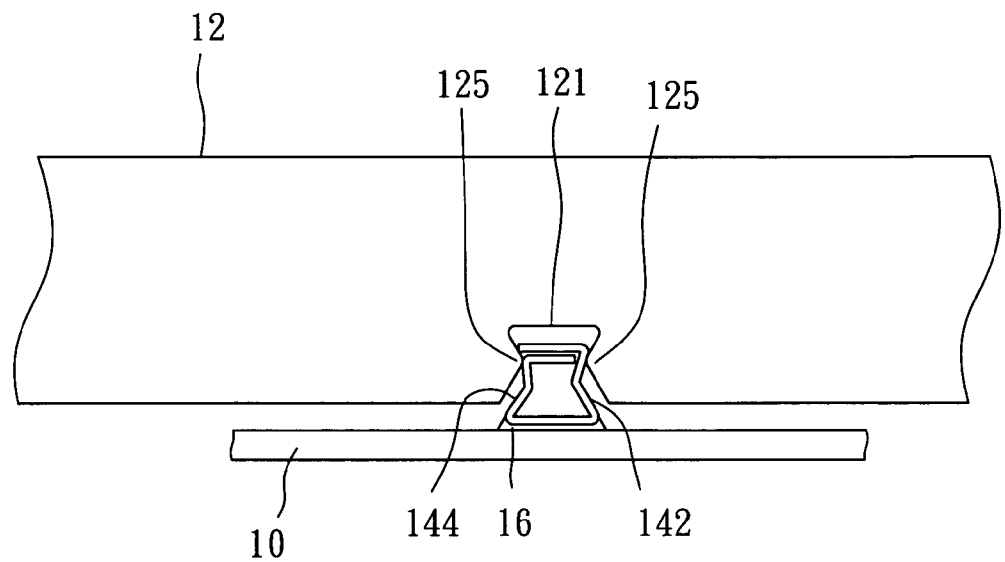
FIG. 13 shows the supporting device going to be assembled with the connecting device.

The supporting 12 is a hollow frame made of plastic to rest a panel and a light guide plate (not shown) thereon. As shown in FIG. 7 to FIG. 9, the supporting device 12 has four slots 121, 122, 123 and 124, each of which is open at both of a bottom and lateral sides of the supporting device 12. The slots 121 and 122 are at opposite sides of the supporting device 12, and the slots 123 and 124 are at another side of the supporting device 12. The slots 121, 122, 123 and 124 are narrow at middle sections, where lock portions 125 are defined, and wide at opposite ends, as shown in FIG. 13.

Figure 10:
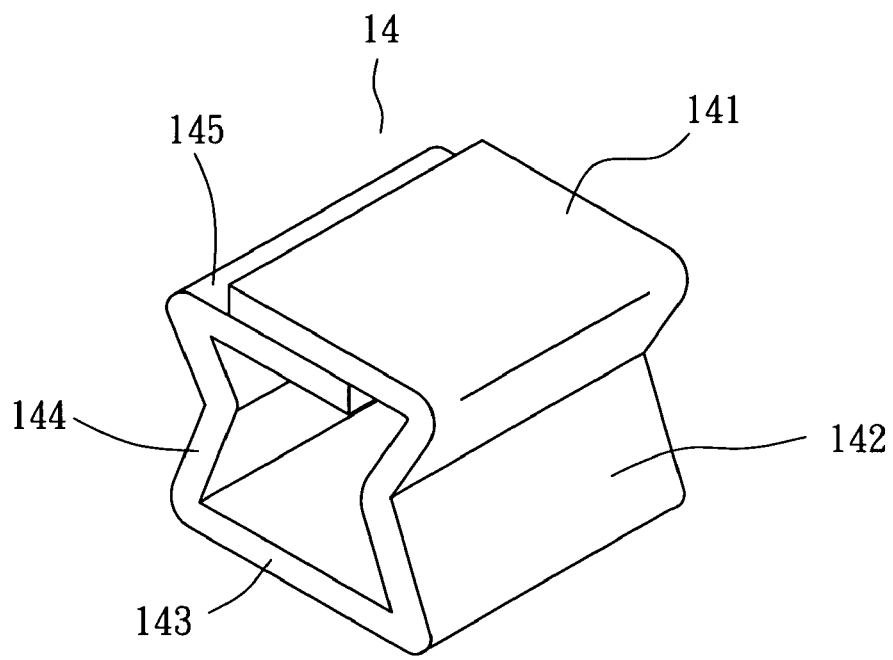
FIG. 10 is a perspective view of the connecting device of the first preferred embodiment of the present invention.
Figure 11:
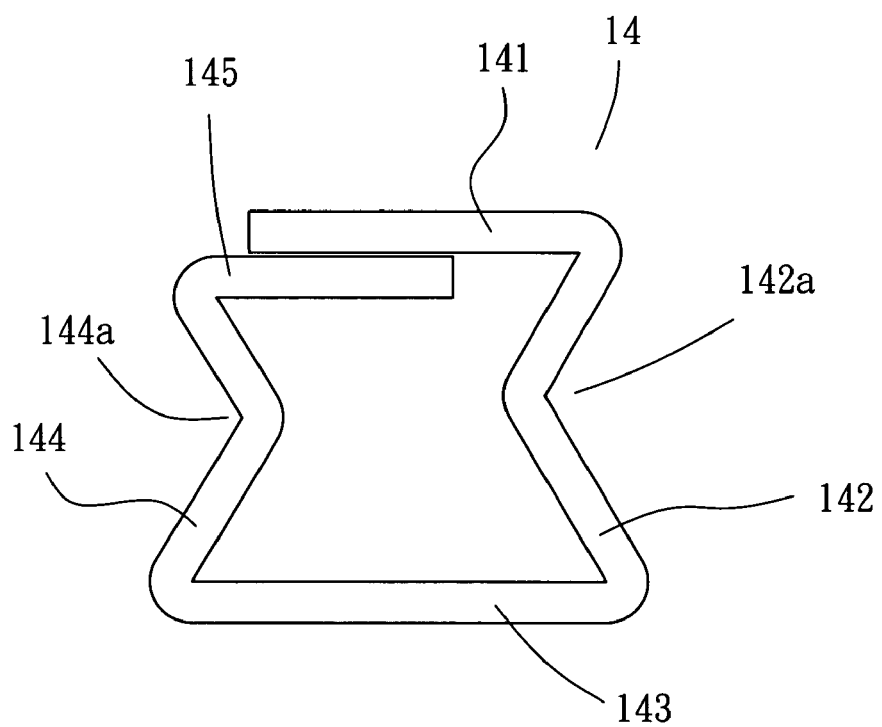
FIG. 11 is a lateral view of the connecting device of the first preferred embodiment of the present invention.

As shown in FIG. 10 and FIG. 11, each of the connecting devices 14 is made of a conductive metal plate bent into a loop having a first plate 141, a second plate 142, a third plate 143, a fourth plate 144 and a fifth plate 145, wherein the first plate 141 and the fifth are overlapped and are opposite to the third plate 143, and the second plate 142 is opposite to the fourth plate 144. The second plate 142 and the fourth plate 144 have a concave portion 142a and 144a respectively. The fifth plate 145 is below the first plate 141 but not fixed with it to keep free movement between the first plate 141 and the fifth plate 145, so that the second plate 142 and the fourth plate 144 are compressed to narrow a width of the connecting device 14. Because of the small sizes of the connecting devices 14, they can be provided to a package tape (not shown) of an automatic machine (not shown).

Figure 12:
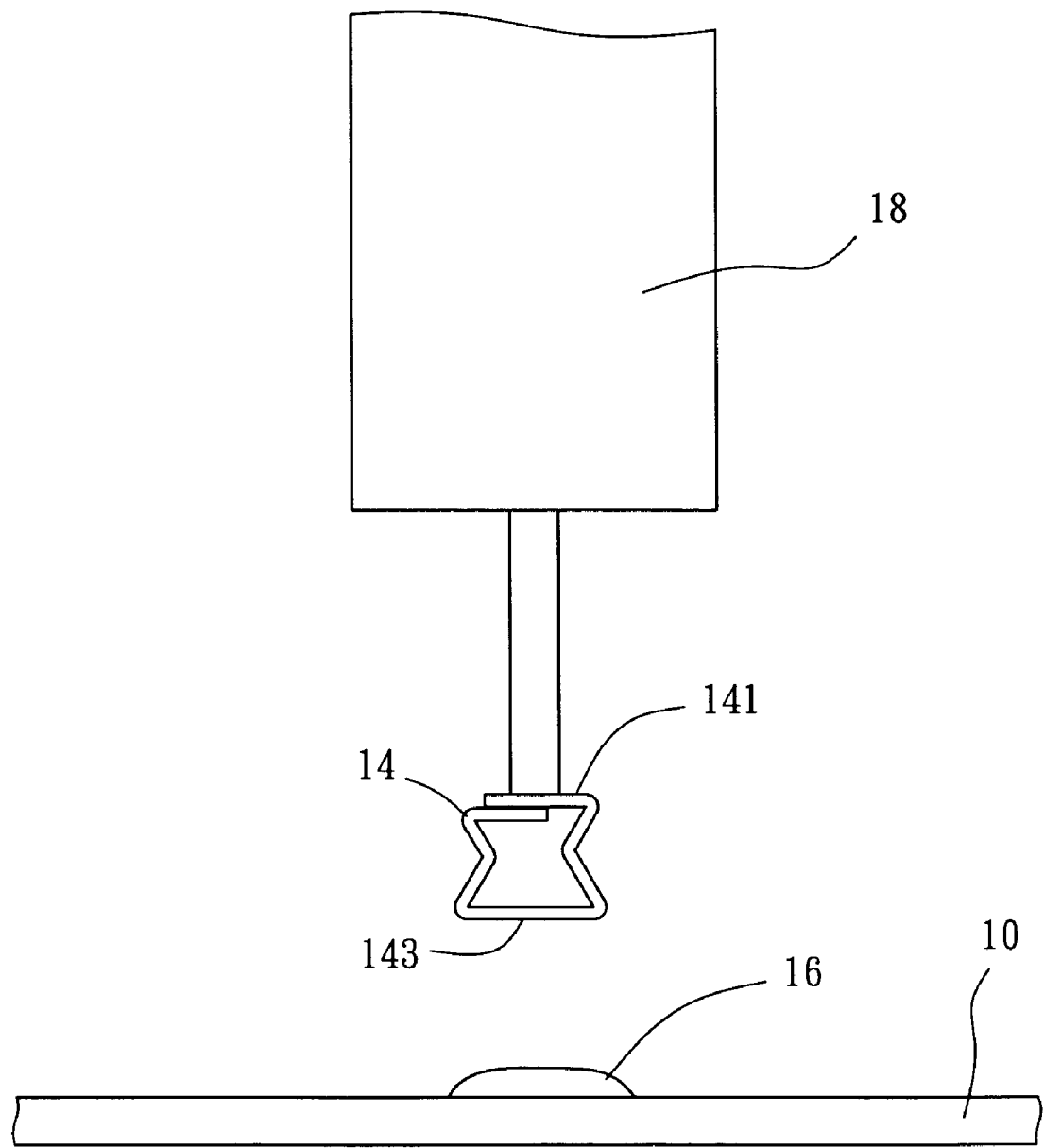
FIG. 12 shows the connecting device being socked.

As shown in FIG. 12, the circuit board 10 is coated with tin paste 16 at a top thereof where are associated with the slots 121, 122, 123 and 124 respectively prior to assembly.

A sucking device 18 of the automatic machine suck the first plates 141 of the connecting devices 14 on the tap, and move them to attach the third plates 123 on the tin pastes 16 on the circuit board 10 respectively. This process can be executed by automatic machine, which increases the efficiency of production. And then, the board 10 with the connecting devices 14 thereon is sent to a stove for welding to bond the connecting devices 14 on the circuit board 10 firmly, as shown in FIG. 6.

Figure 14:
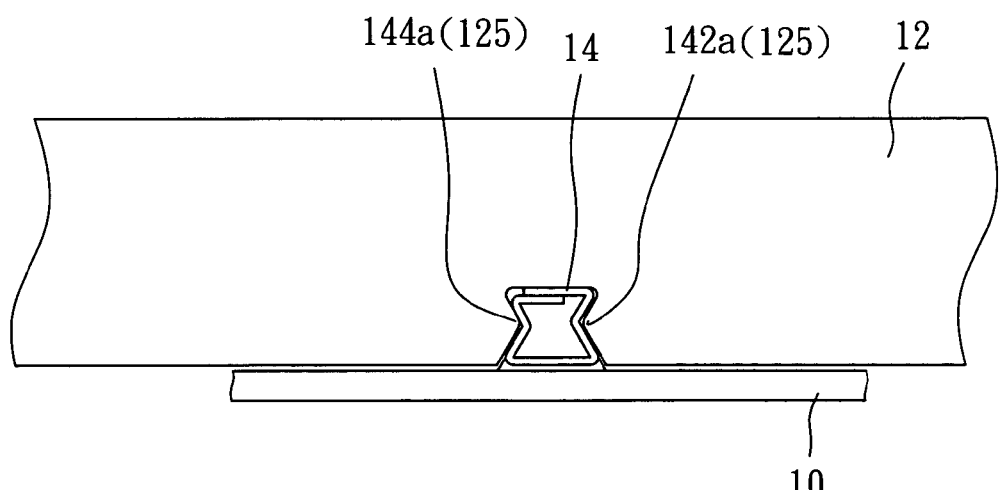
FIG. 14 shows the supporting device being assembled with the connecting device.

To assemble the supporting device 12 and the circuit board 10, the slots 121, 122, 123 and 124 are engaged with the connecting devices 14 on the circuit board 10. As shown in FIG. 13, the connecting device 14 is compressed by the lock portion 125 to narrow the width thereof, so that the first plate 141 and the fifth plate 145 can pass the lock portion 125 of the slot 121, and after that, the connecting device 14 returns its original width, and the lock portion 125 is engaged with the concave portions 142*a* and 144*a* of the connecting device 14. As a result, the connecting device 14 secured in the slots 121 to couple the circuit board 10 to the supporting device 12 firmly. The arrangement of the connecting devices 14 and the slots 121, 122, 123 and 124, which are located at two vertical orientations, can eliminate the tolerance between the supporting device 12 and the circuit board 10 when they are coupled. As shown in FIG. 14, the slots 121, 122, 123 and 124 of the supporting device 12 receive entire connecting devices 14 therein to attach the circuit board 10 on the supporting device 12.

Figure 15:
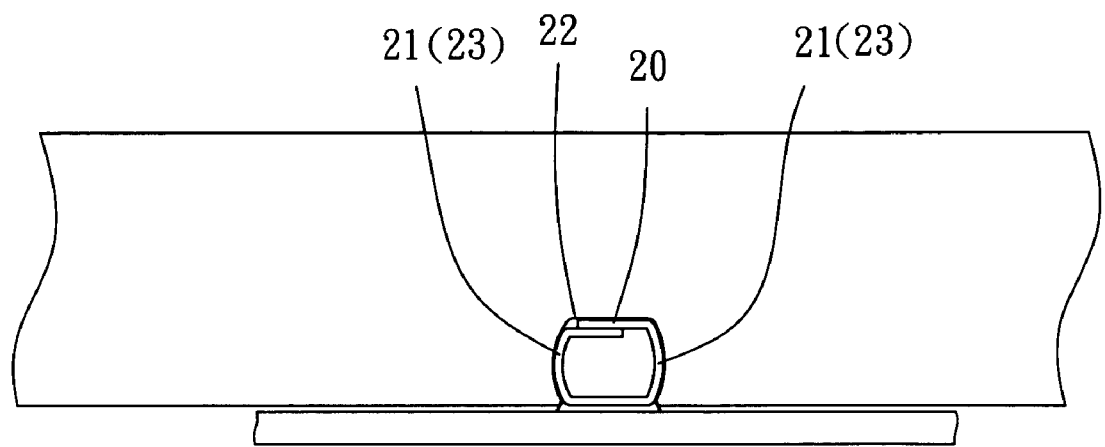
FIG. 15 shows an alternated aspect of the supporting device.
Figure 16:
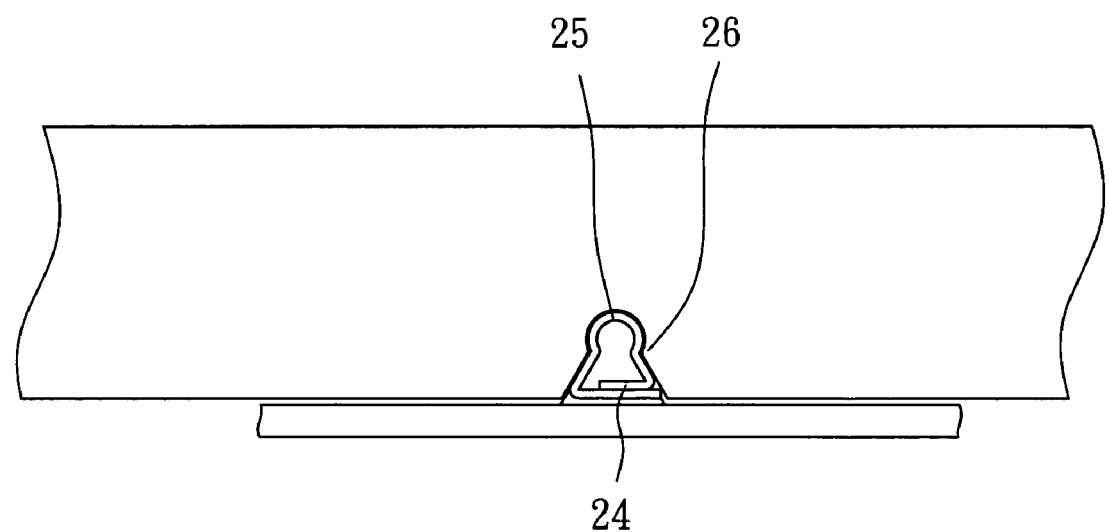
FIG. 16 shows another alternated aspect of the supporting device.

FIG. 15 shows an alternated connecting device 20, which has two convex plates 21 at opposite sides, and a slot 22 of the supporting device has two concave sidewalls 23 to be engaged with the connecting device 20. FIG. 16 shows another alternated connecting device 24, which has a spherical head portion 25 to be squeezed into a slot 26 with a spherical recess at a bottom thereof.

The connecting device of the present invention can be just a block with a specific aspect to be squeezed into the corresponding slot of the supporting device.

According to the description above, there is no twin adhesive tape or glue involved in the present invention, so that there is no adhesive problem as described in the background, as well as the connecting devices are totally received in the slots of the supporting, so that there is no interference problem in assembly also.

Figure 17:
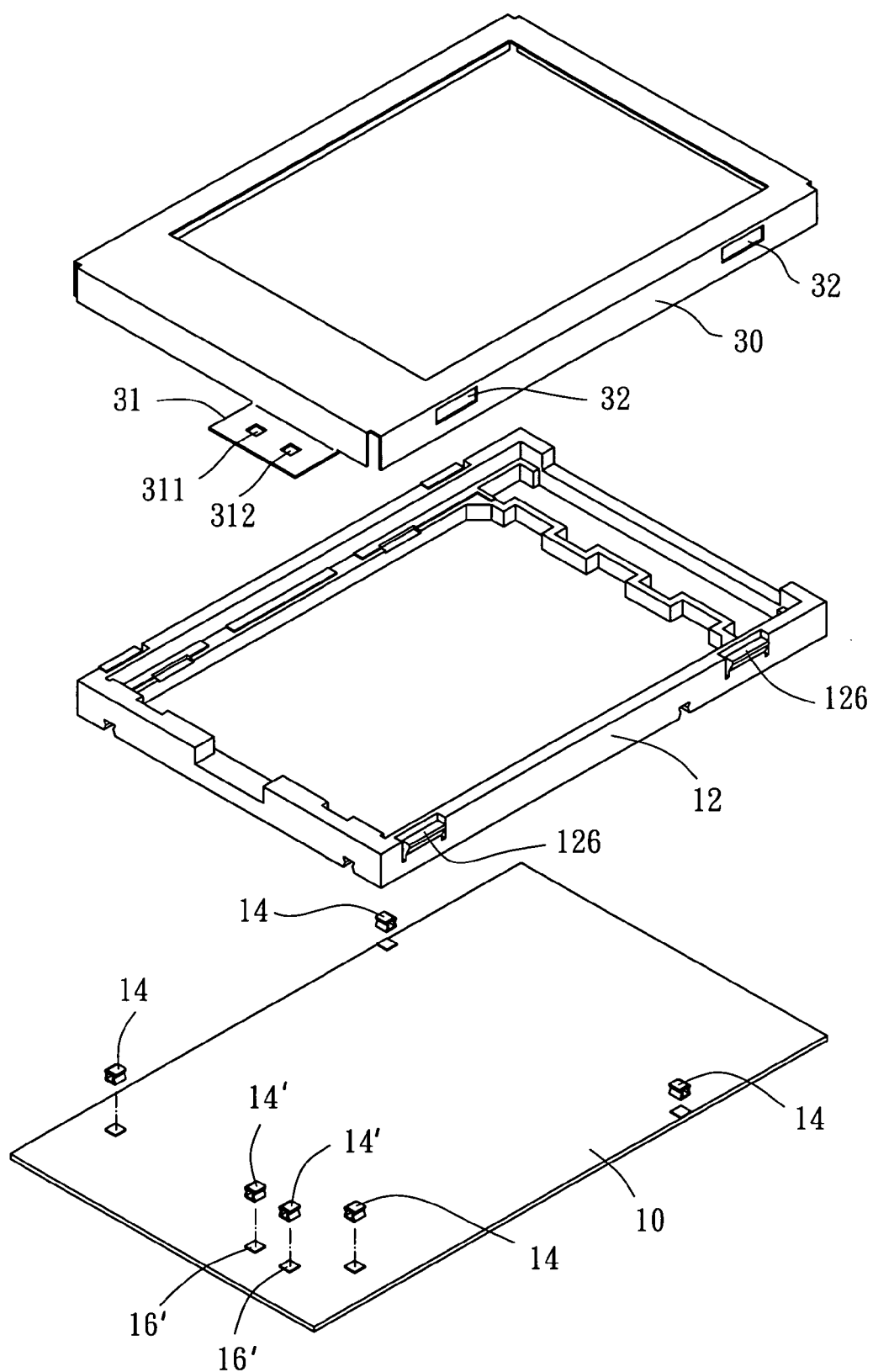
FIG. 17 is an exploded view of a second preferred embodiment of the present invention.

FIG. 17 shows a second preferred embodiment of the present invention, which has a circuit board 10, a supporting device 12, and four connecting devices 14 as same as the first preferred embodiment, except that the second preferred embodiment further has two connecting device 14' and a metal frame 30. The connecting devices 14' are bonded on the circuit board 10 via tin paste 16' also. The metal frame 30 has a horizontal connecting plate 31, on which two holes 311 and 312 are provided, and four openings 32 on lateral sides thereof. The supporting device 12 is provided with four protrusions 126 at lateral sides thereof. In assembly, the metal frame 30 covers the supporting device 12, and the protrusions 126 of the supporting device 12 is engaged with the openings 32 of the metal frame 30 to bond the metal frame 30 to the supporting device 12 firmly. The metal frame 30 provides functions of protecting the supporting device and a panel (not shown) and electrostatic discharge.

Figure 18:
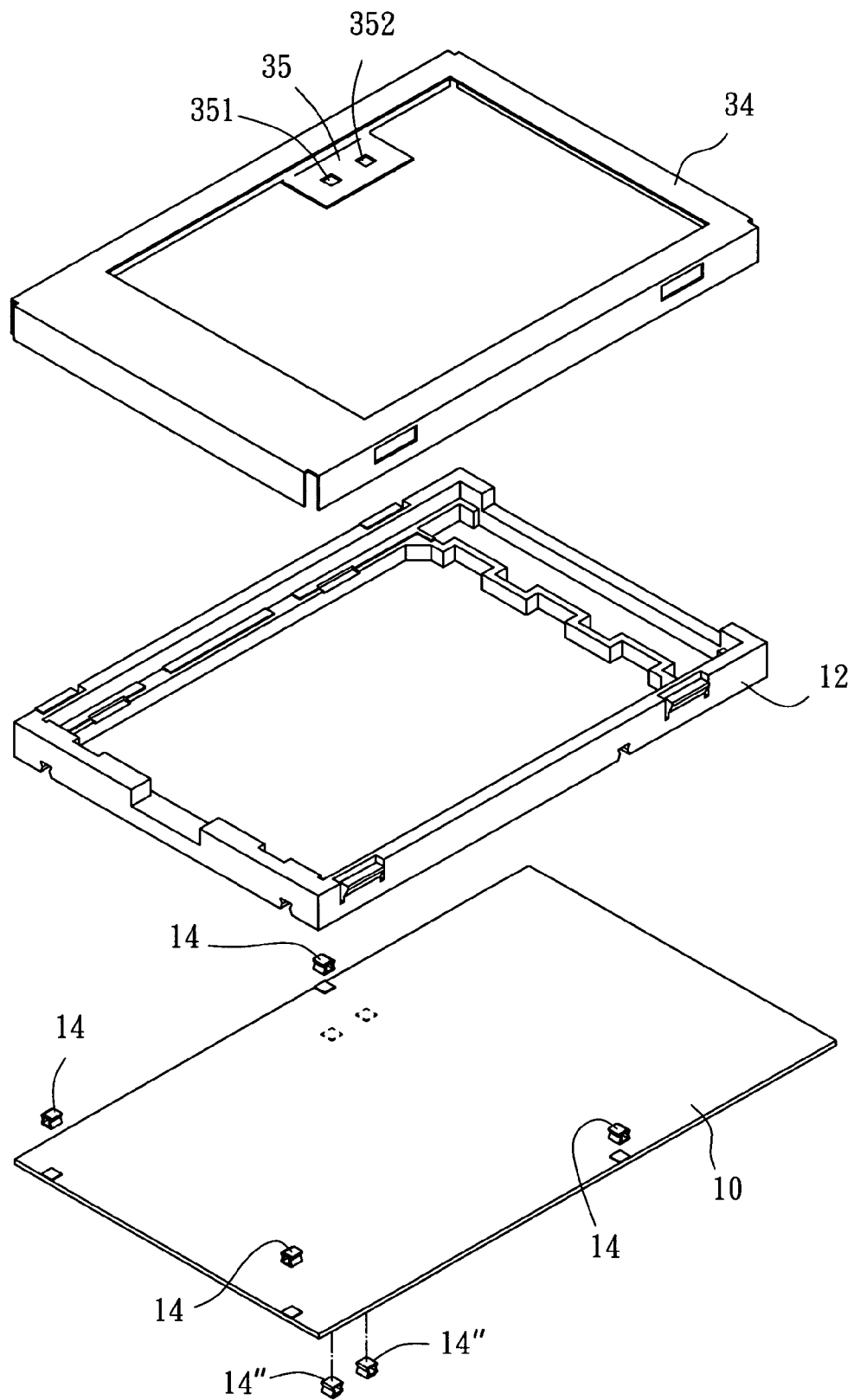
FIG. 18 is an exploded view of a third preferred embodiment of the present invention.

FIG. 18 shows a third preferred embodiment of the present invention having a circuit board 10, a supporting device 12 and four connecting devices 14. The circuit board 10 further has two connecting devices 14" bonded on a bottom side thereof. A metal frame 34 has a connecting plate 35 extended inward, on which two holes 351 and 352 are provided. In assembly, the connecting plate 35 is attached on the bottom side of the circuit board 10 to engage the connecting devices 14" with the holes 351 and 352 respectively. As a result, the metal frame 34 is fixed to the circuit board 10 firmly and electrically connected thereto also. The connecting devices 14" have distal ends extruded out of the connecting plate 35, but it will not interfere with assembly.

Figure 19:
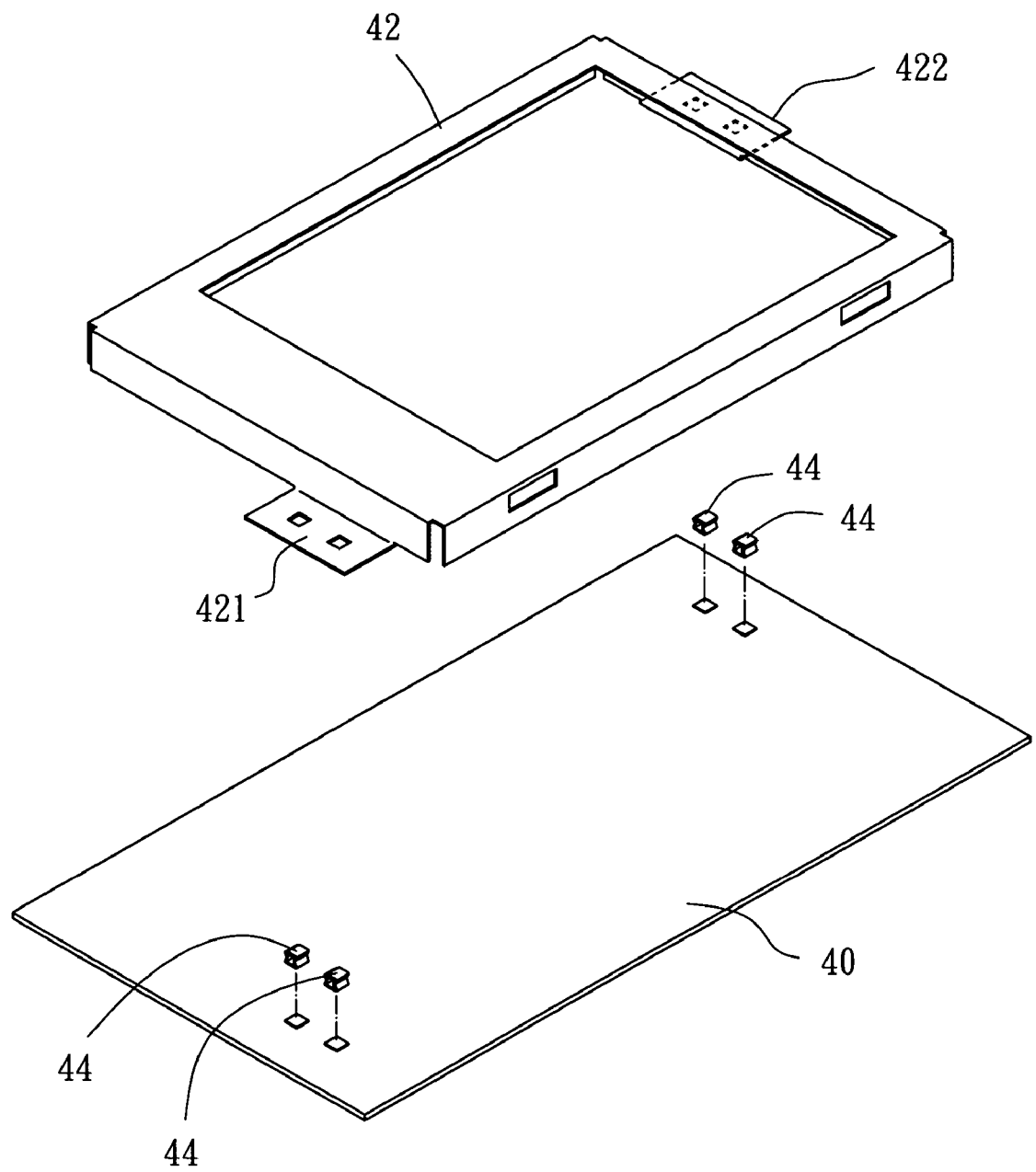
FIG. 19 is an exploded view of a fourth preferred embodiment of the present invention.

FIG. 19 shows a fourth preferred embodiment of the present invention having a circuit board 40, a metal frame 42 and four connecting devices 44. The metal frame 42, which replaces the supporting device as described above, has two connecting plates 421 and 422, on each of which two holes are provided. In assembly, the connecting devices 44 are bonded on the circuit board 40 first, and the metal frame 42 is attached on the circuit board 40 to engage the connecting devices 44 with the holes on the connecting plates 421 and 422 respectively.

Although the invention has been explained in relation to its preferred embodiment, it is to be understood that many other possible modifications and variations can be made without departing from the spirit and scope of the invention as hereinafter claimed.

What is claimed is:

1. An optical display module, comprising:
   a circuit board;
   a supporting device having at least a connecting portion, the connecting portion being a slot;
   at least a connecting device having a top, a bottom and a locking portion between the top and the bottom, wherein the bottom of the connecting device is fixed on the circuit board, and the locking portion is engaged with the connecting portion of the supporting device;
   wherein the connecting device is a bent plate having a first plate, a second plate, a third plate, a fourth plate, and a fifth plate, in which the first plate is the top of the connecting device, and the third plate is the bottom of the connecting device, and the second plate and the fourth plate have the locking portion; and
   wherein the second plate has a concave portion, and the slot has a protrusion at a sidewall thereof to be engaged with the concave portion.

2. The optical display module as defined in claim 1, wherein the first plate is substantially parallel to the third plate.

3. The optical display module as defined in claim 1, wherein a width at an open end of the slot is greater than a width of the third plate.

4. The optical display module as defined in claim 1, wherein the connecting device is made of a conductive material.

5. The optical display module as defined in claim 1, wherein a width of the locking portion of the connecting device is narrower than a width of the top thereof.

6. The optical display module as defined in claim 1, wherein a width of the locking portion of the connecting device is greater than a width of the bottom thereof.

7. The optical display module as defined in claim 1, wherein the connecting device is a block.

* * * * *